US012696467B2

(12) United States Patent
Torres Alonso

(10) Patent No.: US 12,696,467 B2
(45) Date of Patent: Jul. 28, 2026

(54) GRAPHENE DEVICE AND METHOD OF FABRICATING A GRAPHENE DEVICE

(71) Applicant: Graphenea Semiconductor S.L.U., Donostia (ES)

(72) Inventor: Elías Torres Alonso, Donostia (ES)

(73) Assignee: GRAPHENEA SEMICONDUCTOR S.L.U., Donostia—San Sebastián (ES)

( * ) Notice: Subject to any disclaimer, the term of this patent is extended or adjusted under 35 U.S.C. 154(b) by 378 days.

(21) Appl. No.: 18/525,116

(22) Filed: Nov. 30, 2023

(65) Prior Publication Data

US 2024/0213351 A1      Jun. 27, 2024

(30) Foreign Application Priority Data

Dec. 23, 2022      (EP) ..................................... 22383283

(51) Int. Cl.

| | |
|---|---|
| H10D 30/01 | (2025.01) |
| H10D 62/80 | (2025.01) |
| H10D 62/83 | (2025.01) |
| H10D 64/01 | (2025.01) |
| H10P 14/692 | (2026.01) |
| H10P 95/00 | (2026.01) |

(52) U.S. Cl.
CPC ......... H10D 30/01 (2025.01); H10D 62/8303 (2025.01); H10D 62/882 (2025.01); H10D 64/01352 (2026.01); H10P 14/6939 (2026.01); H10P 95/064 (2026.01)

(58) Field of Classification Search
CPC .. H10D 30/01; H10D 62/8303; H10D 62/882; H10D 64/01352; H10D 30/47; H10D 64/256; H10P 14/6939; H10P 95/064
See application file for complete search history.

(56) References Cited

U.S. PATENT DOCUMENTS

| | | | |
|---|---|---|---|
| 8,796,096 B2 | 8/2014 | Farmer et al. | |
| 8,803,130 B2 | 8/2014 | Afzali-Ardakani et al. | |
| 9,061,912 B2 * | 6/2015 | Zhang ..................... | B82Y 30/00 |

(Continued)

OTHER PUBLICATIONS

European Search Report for European Application No. 22383283.3, dated Jun. 16, 2023, 9 pages.

*Primary Examiner* — Chad M Dicke
*Assistant Examiner* — Jeremy Daniel Watts
(74) *Attorney, Agent, or Firm* — CANTOR COLBURN LLP

(57) ABSTRACT

A method of fabricating a graphene-based solid-state device includes: disposing a graphene layer on a substrate; depositing a first layer of a sacrificial material on the graphene layer, the first layer made of a first oxide dielectric material; patterning the graphene layer by defining at least one channel region, by applying a lithographic process followed by etching; depositing a second layer of a sacrificial material on the stacked structure, the second layer made of a second oxide dielectric material different from the first. The selectivity to at least one etchant of the first oxide dielectric material is different from the selectivity to at least one etchant of the second. Also included is defining contact areas on which metal is deposited; etching away portions of the sacrificial material layers, defining hollow portions through which graphene areas are exposed; and in a single deposition stage, applying metal depositions on defined contact areas.

13 Claims, 9 Drawing Sheets

(56)           References Cited

U.S. PATENT DOCUMENTS

| | | | | |
|---|---|---|---|---|
| 9,679,970 | B1 * | 6/2017 | Son | H10D 62/882 |
| 2011/0201201 | A1 * | 8/2011 | Arnold | B82Y 30/00 |
| | | | | 257/E21.257 |
| 2012/0329260 | A1 | 12/2012 | Avouris et al. | |
| 2013/0098540 | A1 * | 4/2013 | Lee | H10D 30/6741 |
| | | | | 428/209 |
| 2013/0207080 | A1 | 8/2013 | Dimitrakopoulos et al. | |
| 2017/0011930 | A1 * | 1/2017 | Jeong | H10D 62/882 |
| 2018/0130912 | A1 | 5/2018 | Tateno et al. | |

* cited by examiner

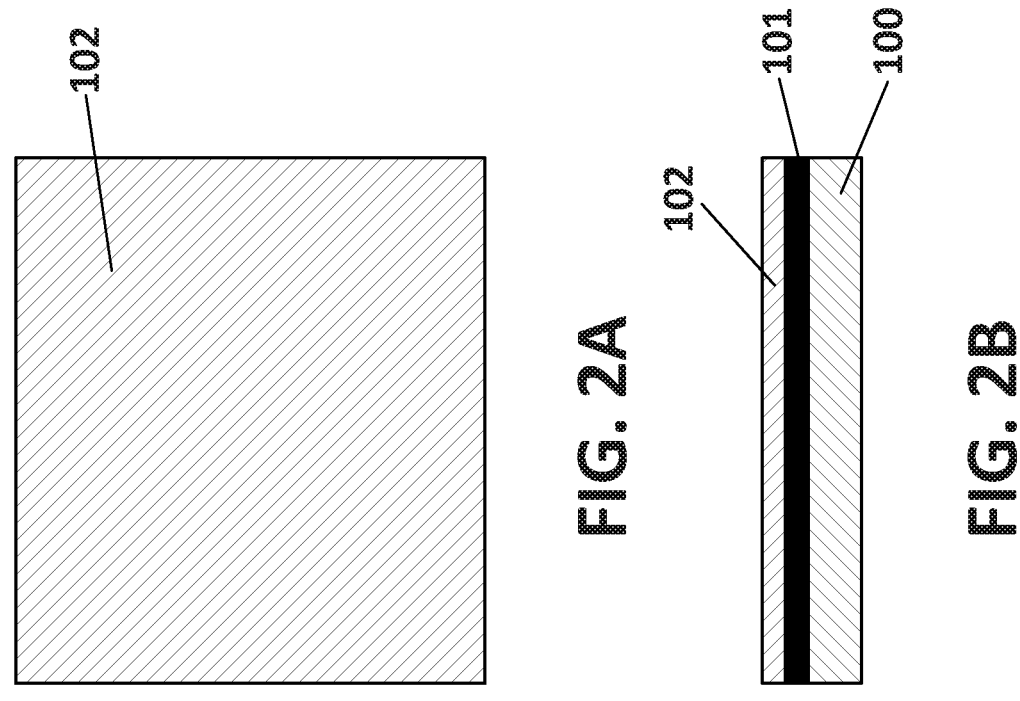
FIG. 1A
FIG. 1B
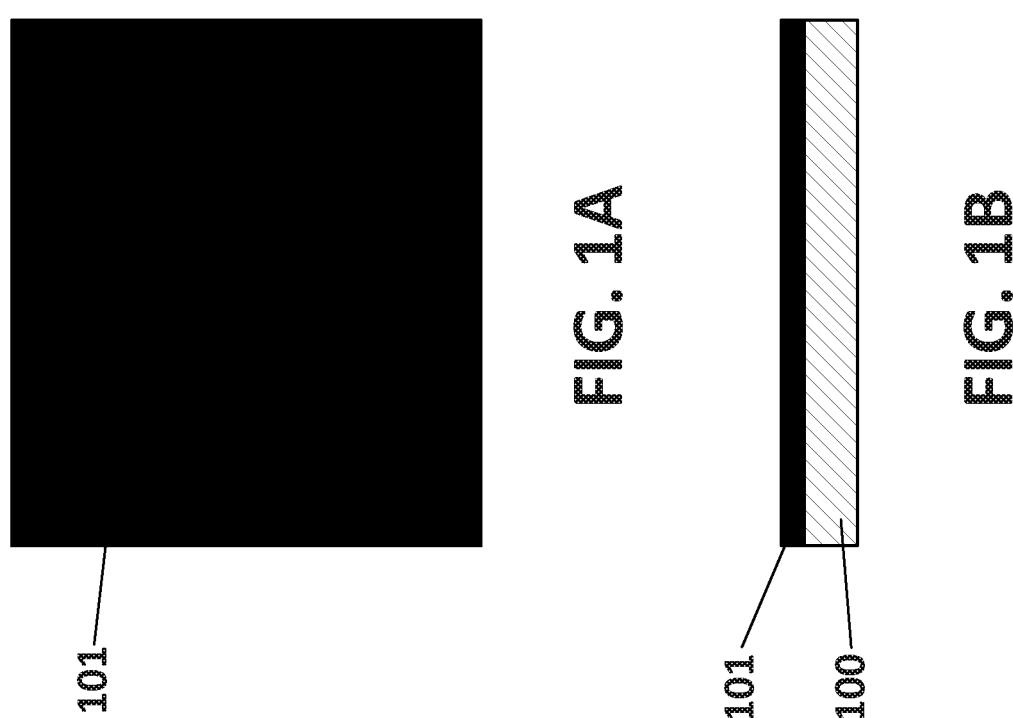
FIG. 2A
FIG. 2B

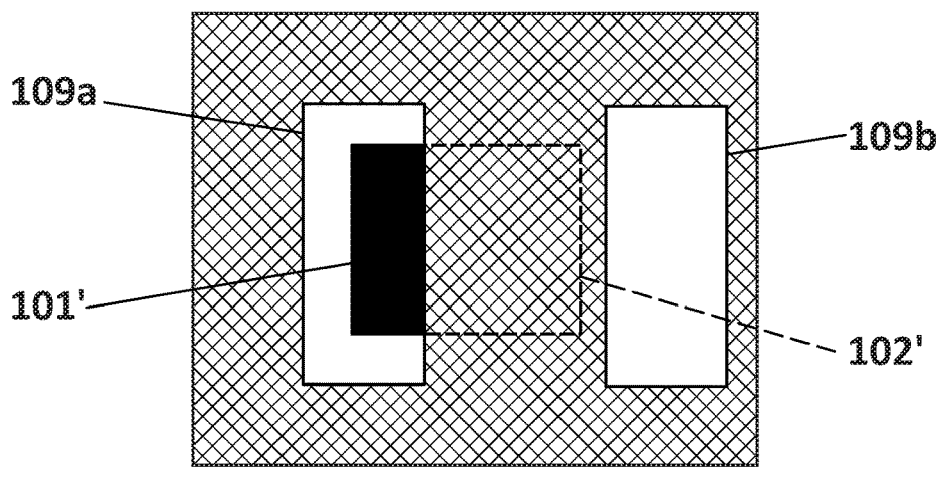
FIG. 11C
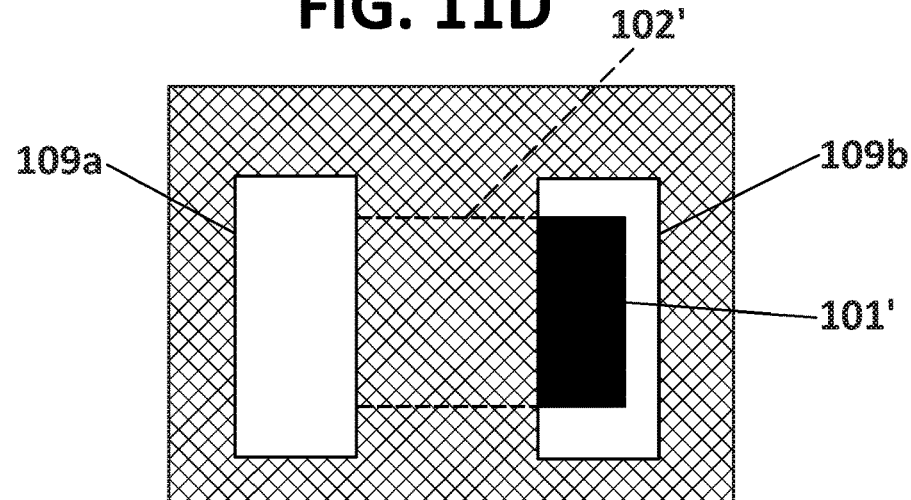
FIG. 11D
FIG. 11E
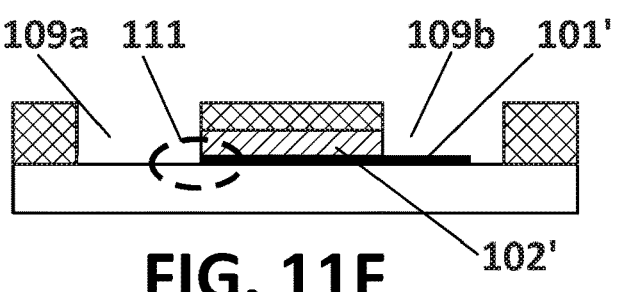
FIG. 11F

GRAPHENE DEVICE AND METHOD OF FABRICATING A GRAPHENE DEVICE

CROSS-REFERENCE TO RELATED APPLICATIONS

This application claims the benefit of European patent application 22383283.3, filed on 23 Dec. 2022, the disclosure of which is incorporated herein by reference in its entirety.

TECHNICAL FIELD

The present disclosure relates to the field of semiconductors and electronics industry and, in particular, to graphene-based solid-stated devices and associated methods.

BACKGROUND

Since its discovery at the beginning of the $21^{st}$ century, graphene has attracted much attention due to its properties, such as high electronic mobility, low density of states and low charge density. These properties make graphene an ideal material in a myriad of electronic applications, such as RF devices, magnetic sensors, biosensors and photodetectors, among others. However, when fabricating graphene devices, these attributes are usually not observed due to contamination in the form of impurities, residues and defects introduced during the processing of the graphene films to obtain the graphene devices.

The major cause of contamination in these devices is introduced in the form of polymeric contamination, mainly due to the photoresists used during processing. This reduces the quality of the metallic contact subsequently deposited, and thus increases contact resistance, resulting in poor carrier injection, and degrades electron mobility in the channel due to scattering caused by the polymeric residues and impurities. Moreover, when creating the contact pattern via photoresist prior to metal deposition, the graphene is usually in contact with strong bases used in the photoresist development and lithographic processing in general. This causes graphene detachment, reducing the contact area and decreasing the carrier injection again.

Graphene-based solid-state devices, such as graphene transistors, like graphene-based field effect transistors (GFETs), are expected to provide spectacular performance in high-frequency RF applications. A GFET is basically formed by a graphene film that electrically connects a source contact and a drain contact. In GFETs, self-aligned gate structures are desirable to ensure uniformity of certain parameters, such as parasitic capacitance. The development of some self-aligned gate processes meant a tremendous advancement in microelectronic fabrication. These processes allowed for improved parasitic characteristics and a tighter spacing between the source, gate and drain electrodes, which essentially boosted miniaturization and brought it to new levels.

Examples of graphene devices having aligned electrodes and fabrication processes thereof are shown in US2012/0329260A1 and in U.S. Pat. No. 8,803,130B2, which disclose GFETs having source and drain electrodes which are self-aligned to a gate electrode and methods of their fabrication. However, the fabrication processes proposed in these documents entail the abovementioned problems: On the one hand, to pattern the graphene layer to define the design of the GFET to be subsequently formed, the graphene is in touch with a photoresist made of PMMA, causing the graphene contamination and detachment already mentioned. Besides, it leaves parts of the graphene unexposed, which is undesirable as those parts will suffer from environmental doping and the conductivity of the channel will change without control. In addition, the proposed fabrication processes require multiple metallization steps, which increases complexity and material consumption, which is undesirable.

Another self-aligned method of fabrication of a GFET is disclosed in U.S. Pat. No. 8,796,096B2. However, it also requires multiple metallization steps. Besides, the contacts are semi-suspended contacts, which render poor carrier injection and low yield due to graphene detachment and tearing during fabrication.

Therefore, there is a need to develop new methods of fabricating graphene-based solid-state devices which overcome the above-mentioned drawbacks.

SUMMARY

The present disclosure provides a new method of fabricating a graphene-based solid-state device and a new graphene-based solid-state device, which overcome the drawbacks of conventional devices and methods of fabrication of these devices.

The disclosure provides a fabrication process of a solid-state device (also referred to as semiconductor device) comprising graphene. Solid-state devices are typically based on a semiconductor material, such as silicon, germanium, gallium arsenide or an organic semiconductor. The semiconductor conductivity can be controlled by the introduction of an electric or magnetic field, by exposure of light or heat, or by other means, so that the semiconductor material can perform as a sensor. Current flow in a semiconductor occurs due to mobility of free electrons, also called charge carriers. The graphene-based solid-state device can be any solid-state device in which the semiconductor material is graphene, for example a graphene channel. The graphene-based semiconductor device to which the fabrication process of the disclosure is applicable can be a three-terminal device, such as a transistor or, more generally, an N-terminal device wherein $N \geq 3$. In other words, the graphene-based solid-state device is a device having at least three contacts. Non-limiting examples of graphene-based solid-state devices to which the fabrication process of the disclosure is applicable are: triodes, bipolar junction transistors, field-effect transistors, metal-oxide semiconductors, High-electron mobility transistors (HEMTs), thyristors, barristors, memristors, photodetectors, magnetoresistive devices, spin valves, spin torque devices, bolometers and hybrid transition metal dichalcogenide/graphene based heterostructures, among others. Also, inverters, having for example 5 terminals, can be manufactured as well. In a particular embodiment, the graphene-based solid-state device to which the fabrication process is applicable, is a GFET.

The resulting graphene-based solid-state device has at least three contacts, such as top contacts or edge contacts, whose metallic depositions are applied in a same metal deposition step. These contacts are therefore aligned with high accuracy.

The method involves patterning the graphene channel(s) and/or the metal depositions. In the context of the present disclosure, patterning involves stages of resist deposition, mask exposure and development. The patterns (geometric shape or profile) of the graphene channel(s) and/or metallic depositions to be applied to the graphene device have been previously designed with computer-aided techniques, such as CAD software or the like. The computer-aided design permits to define areas or regions on the surface of the die over which graphene channel(s) are to be defined and/or metallization is to be deposited. Conventional patterning processes cause contamination, mainly polymeric contamination, for example due to the photoresists used during processing. The proposed method prevents this contamination by passivating the graphene layer with a sacrificial layer during the whole fabrication process. When the graphene device is a GFET, the sacrificial layer is part of the gate dielectric. Therefore, the gate dielectric protects the graphene and acts as mask in during the lithographic process to define the graphene channel. By preventing the direct interaction or contact between the graphene and polymers (i.e. resists and developers), contamination of the graphene channel is prevented and therefore the final quality of the device is increased.

A novel geometry for the contacts, such as source-drain contacts in the case of a GFET, is proposed. In a proposed geometry, contacts are placed within the graphene channel, as opposed to standard contact schemes, where contacts are placed at the lateral sides of the graphene channel (at the border side between the graphene channel and, for example, the substrate on which the graphene channel is disposed). This relaxes the alignment tolerance, as one could extend the lateral sides of the graphene channel as much as needed without altering the actual length or width of the device. This also avoids large exposure of the photoresist developers that can cause detachment of the graphene film, deteriorating the quality of the contact.

The proposed method enables the fabrication of fully encapsulated, self-aligned contacts defined within the graphene channel. In the context of the present disclosure, a contact built within the graphene channel is a contact which is either surrounded by graphene along the whole perimeter of the lower surface or base of the contact (edge contact) or deposited on the upper surface of the graphene channel (top contact) but not at the lateral side of the graphene channel (this lateral side defining the border between the graphene channel and the substrate). For example, a contact built within the graphene channel does not extend beyond the graphene layer, for example occupying portions of the substrate not occupied by the graphene layer. In other words, contacts defined within the graphene channel are contacts not colliding with or overpassing the lateral sides of the graphene channel. It is noted that contacts within the graphene channel can be either top contacts (when they are deposited on the upper surface of the graphene channel) or edge contacts (when they are in contact with the graphene channel only at the outer perimeter of the contact and not at the lower surface thereof; in other words, edge contacts are in contact with the graphene channel only along the thickness (height) of the graphene channel).

The method provides a versatile route for metallization compatible with different metallization techniques, such as lift-off, CVD or electroplating metallization schemes.

The device (or, more precisely, its metalization) is produced just with one metalization step, thus reducing processing steps and material consumption. The metallization process is aimed at creating electrical contacts in the graphene device: for example, but not limiting, one contact (such as source contact) to enable a subsequent connection to an electric negative pole (of, for example, a voltage source), another contact (such as drain contact) to enable a corresponding subsequent connection to an electric positive pole (of, for example, the voltage source), and a gate contact.

In a first aspect of the present disclosure, a method of fabricating a graphene-based solid-state device is provided.

The method comprises: disposing a graphene layer on a substrate; depositing a first layer of a sacrificial material on the graphene layer, the first layer of a sacrificial material being made of a first oxide dielectric material; patterning the graphene layer by defining at least one channel region, wherein the patterning is done by applying a lithographic process followed by an etching process; depositing a second layer of a sacrificial material on the stacked structure (the stacked structure being the substrate/graphene layer/first layer of sacrificial material stack), the second layer of a sacrificial material being made of a second oxide dielectric material different of the first oxide dielectric material of which the first layer of a sacrificial material is made; and wherein the selectivity to at least one etchant of the first oxide dielectric material is different from the selectivity to said at least one etchant of the second oxide dielectric material; defining contact areas on which metal will be subsequently deposited; etching away portions of the second and first layers of sacrificial material, thus defining hollow portions through which graphene areas are exposed; in a single deposition stage, applying metal depositions on the defined contact areas.

In embodiments of the disclosure, the substrate is made of a material comprising at least one of the following: glass, quartz, silicon (Si), germanium (Ge), silicon carbide, silicon oxide, gallium arsenide, $SiO_2/Si$, $SiO_2$, $Al_2O_3$, $ZrO_2$, $HfO_2$, $HfSiO_4$, $Ta_2O_5$, $La_2O_3$, $LaAlO_3$, $Nb_2O_5$, $TiO_2$, $BaTiO_3$, $SrTiO_3$, $CaCu_3Ti_4O_{12}$, $Si_3N_4$, $ZrSiO_4$, $Y_2O_3$, CaO, MgO, BaO, $WO_3$, $MoO_3$, $Sc_2O_3$, $Li_2O$ and SrO.

The graphene layer can be a monolayer of graphene of a two-dimensional film. Alternatively, the graphene layer can be a stack of a plurality of two-dimensional graphene monolayers. The stack typically does not have more than 10 monolayers, such no more than 8 monolayers or even no more than 5 monolayers.

In embodiments of the disclosure, the graphene layer is either deposited or grown on the substrate.

In embodiments of the disclosure, defining contact areas on which metal will be subsequently deposited and etching away portions of the second and first layers of sacrificial material, thus defining hollow portions through which graphene areas are exposed, are done as follows: applying a first lithographic process to define preliminary areas in contact with the graphene channel on which metal will be subsequently deposited; applying an etching process to etch away the second layer of a sacrificial material on the region corresponding to the defined preliminary areas, thus defining hollow portions through which corresponding portions of the first layer of a sacrificial material is exposed; applying a second lithographic process to define contact areas on which metal will be subsequently deposited, said contact areas comprising as many areas as metallic contacts are going to be deposited; applying an etching process to etch away the first layer of a sacrificial material on the defined contact areas on which metallic contacts are going to be deposited, thus defining a hollow portion through which a corresponding graphene area is exposed.

In embodiments of the disclosure, the first oxide dielectric material is an inorganic oxide dielectric material.

In embodiments of the disclosure, the second oxide dielectric material is an inorganic oxide dielectric material.

In embodiments of the disclosure, the first oxide dielectric material is selected from the following group: $SiO_2$, $Al_2O_3$, $ZrO_2$, $HfO_2$, $HfSiO_4$, $Ta_2O_5$, $La_2O_3$, $LaAlO_3$, $Nb_2O_5$, $TiO_2$, $BaTiO_3$, $SrTiO_3$, $CaCu_3Ti_4O_{12}$, GaN, TaN, $Si_3N_4$, $ZrSiO_4$, $Y_2O_3$, CaO, MgO, BaO, $WO_3$, $MoO_3$, $Sc_2O_3$, $Li_2O$ and SrO.

In embodiments of the disclosure, the second oxide dielectric material is selected from the following group: $SiO_2$, $Al_2O_3$, $ZrO_2$, $HfO_2$, $HfSiO_4$, $Ta_2O_5$, $La_2O_3$, $LaAlO_3$, $Nb_2O_5$, $TiO_2$, $BaTiO_3$, $SrTiO_3$, $CaCu_3Ti_4O_{12}$, GaN, TaN, $Si_3N_4$, $ZrSiO_4$, $Y_2O_3$, CaO, MgO, BaO, $WO_3$, $MoO_3$, $Sc_2O_3$, $Li_2O$ and SrO, provided that the second oxide dielectric material is different of the first oxide dielectric material and the selectivity to at least one etchant of the first oxide dielectric material is different from the selectivity to said at least one etchant of the second oxide dielectric material.

In embodiments of the disclosure, the patterning of the graphene channel is done as follows: applying a wet etching technique to dissolve the area of the first layer of a sacrificial material not covered by a resist layer, exposing the graphene layer(s) underneath; applying a dry etching technique to remove the area of graphene layer(s) not covered by the first layer of a sacrificial material.

In embodiments of the disclosure, the patterning of the graphene channel is done as follows: applying a dry etching technique to remove both the area of the first layer of a sacrificial material and the graphene layer(s) underneath.

In embodiments of the disclosure, the preliminary area in contact with the graphene channel on which metal will be subsequently deposited is an area on top of the graphene channel.

In embodiments of the disclosure, the preliminary area in contact with the graphene channel on which metal will be subsequently deposited is an area at the edge of the graphene channel.

In embodiments of the disclosure, the etchant used in the stage of applying an etching process to etch away the second layer of a sacrificial material on the region corresponding to the defined area, thus defining a hollow portion through which a portion of the first layer of a sacrificial material is exposed, does not need to have good selectivity against the first layer of sacrificial material.

In embodiments of the disclosure, the etchant used in the stage of applying an etching process to etch away the first layer of a sacrificial material on the defined contact area on which metallic contacts are going to be deposited, thus defining a hollow portion through which a corresponding graphene area is exposed, has good selectivity to the first layer of sacrificial material, so that the first layer of sacrificial material is not damaged.

In a second aspect of the present disclosure, a graphene-based solid-state device, is provided. It comprises: a substrate; a graphene layer disposed on the substrate, the graphene layer defining at least one graphene channel, the graphene layer being protected by a first layer of a sacrificial material, wherein the first layer of a sacrificial material is a first oxide dielectric material; a second layer of a sacrificial material disposed on the stacked structure, the second layer of a sacrificial material being made of a second oxide dielectric material different of the first oxide dielectric material of which the first layer of a sacrificial material is made; and wherein the selectivity to at least one etchant of the first oxide dielectric material is different from the selectivity to said at least one etchant of the second oxide dielectric material; a first metallic contact disposed on the second layer of a sacrificial material and at least two metallic contacts disposed on an exposed graphene area of the graphene channel.

In embodiments of the disclosure, the graphene-based solid-state device is a GFET, and the first metallic contact is a gate contact and the at least two metallic contacts are drain and source contacts.

The gate contact is aligned with the source and drain contacts because a single metalization stage is used to deposit the three metal contacts (i.e. for gate, drain and source). The risk of contacts overlapping is thus minimized.

The proposed method is especially suitable for the application of top-contact metallization and/or edge-contact metallization to the graphene channel-based device. It is also suitable for graphene-based solid-state devices having both top-contacts and other type of contacts, such as edge contacts and/or back-contacts.

In the present disclosure, the major cause of contamination in the graphene device, typically introduced in the form of polymeric contamination, mainly due to the resists in the patterning process, is prevented because the graphene layer(s) and channel(s) is/are always protected or passivated by a non-contaminating dielectric made of an inorganic oxide. Thus, the quality of the metallic contact is increased (for example, the contact resistance is reduced), resulting in improved carrier injection and electron mobility.

In addition, when the metallic contacts (such as drain and source contacts when the device is a GFET) are defined and built within the graphene channel, regardless of they being top or edge contacts, instead of at the lateral sides thereof (at the lateral sides thereof meaning in areas of the graphene delimiting with, for example, the substrate, as is the case in standard contact schemes), the alignment tolerance is relaxed, because the lateral sides of the graphene channel can be extended as much as needed without altering the actual length or width of the device. This also avoids large lateral side exposure of the photoresist developers that can cause detachment of the graphene film, deteriorating the quality of the contact. In sum, this contact geometry prevents misalignment problems and graphene detachment).

Additional advantages and features of the disclosure will become apparent from the detailed description that follows and will be particularly pointed out in the appended claims.

BRIEF DESCRIPTION OF THE DRAWINGS

To complete the description and in order to provide for a better understanding of the disclosure, a set of drawings is provided. Said drawings form an integral part of the description and illustrate an embodiment of the disclosure, which should not be interpreted as restricting the scope of the disclosure, but just as an example of how the disclosure can be carried out. The drawings comprise the following figures:

FIGS. 1A and 1B respectively illustrate a top view and a cross-section view of a graphene film deposited on a substrate.

FIGS. 2A and 2B respectively illustrate a top view and a cross-section view of a first layer of sacrificial material disposed on the graphene film deposited on the substrate, according to an embodiment of the present disclosure.

FIGS. 8A-8B respectively illustrate a top view and a cross-section view of a stage of metal contacts deposition according to an embodiment of the present disclosure.

FIGS. 9A-9B and 10A-10B respectively illustrate a top view and a cross-section view of a stage of metal contacts deposition according to another embodiment of the present disclosure.

FIGS. 11A-11F illustrate top and cross-section views of a graphene structure obtained during the fabrication stages of a graphene device using a standard contact approach, in which the contact areas to receive metal depositions are defined at the lateral sides of the graphene channel.

DETAILED DESCRIPTION OF THE DRAWINGS

Figure 3A:
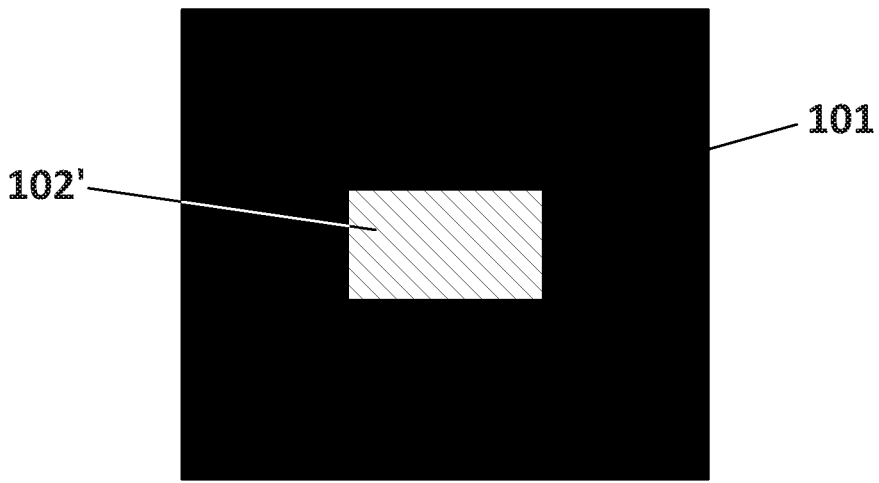
FIGS. 3A-3C respectively illustrate a top view and two cross-section views of a lithographic process to define a graphene channel, according to an embodiment of the present disclosure.

The following description is not to be taken in a limiting sense but is given solely for the purpose of describing the broad principles of the disclosure. Next embodiments of the disclosure will be described by way of example, with reference to the above-mentioned drawings showing apparatuses and results according to the disclosure.

In accordance with some embodiments of the disclosure, a three-terminal graphene-based solid-state device (hereinafter "graphene device") is provided. The fabrication process of the graphene device is explained in detail next. Certain drawings and elements thereof refer, in particular, to the fabrication process of a GFET. For example, expressions like "source contact", "drain contact" and "gate contact" are sometimes used to identify different contacts of the graphene device. This should not be considered to limit the scope of the method and device of the disclosure, which are also applicable to other graphene devices different from GFETs, which have similar or equivalent contacts, or even a different number of contacts, such as 5 contacts, and which can be fabricated following a same or similar process.

FIGS. 1A-10B schematically illustrate different processing stages of structures in accordance with various embodiments related to the fabrication of a graphene device. Figures labelled as "A" (1A, . . . , 10A) represent top views of different fabrication stages, while figures labelled as "B" or "C" (1B, . . . , 10B) represent cross-section views of the different fabrication stages.

Referring to FIGS. 1A-1B, in accordance with embodiments of the disclosure, a substrate 100 is provided. The substrate 100 may comprise a semiconductor and/or an insulating material. Any substrate compatible with the different steps for fabricating a graphene device, can be used. The substrate 100 may be rigid or flexible. The substrate 100 is cleaned, for example via plasma ashing, to remove impurities and increase hydrophilicity. This is done prior to the deposition or growing of a graphene layer. Examples of semiconductor and insulating materials that may be used are glass, quartz, silicon (Si), germanium (Ge), silicon carbide, silicon oxide, gallium arsenide, SiO2/Si, SiO2, Al2O3, ZrO2, HfO2, HfSiO4, Ta2O5, La2O3, LaAlO3, Nb2O5, TiO2, BaTiO3, SrTiO3, CaCu3Ti4O12, Si3N4, ZrSiO4, Y2O3, CaO, MgO, BaO, WO3, MoO3, Sc2O3, Li2O or SrO. In embodiments of the disclosure, the substrate may be formed by two layers (upper layer and lower layer). The lower layer may be made of one of silicon, silicon oxide, glass, quartz and polymeric material. The higher layer may be made, for example, of glass, quartz, Si, SiO2/Si, SiO2, Al2O3, ZrO2, HfO2, HfSiO4, Ta2O5, La2O3, LaAlO3, Nb2O5, TiO2, BaTiO3, SrTiO3, CaCu3Ti4O12, Si3N4, ZrSiO4, Y2O3, CaO, MgO, BaO, WO3, MoO3, Sc2O3, Li2O or SrO. For example, the substrate may be formed by a silicon dioxide layer deposited on a silicon substrate layer, in turn obtained from doped silica (n++Si).

In some embodiments, the substrate 100 is a sacrificial substrate, meaning that a graphene device may be fabricated on the sacrificial substrate and then transferred to another substrate. Any suitable substrate material may be used as sacrificial substrate, providing the substrate material is compatible with the different fabrication steps. A graphene layer 101 is deposited, transferred or grown on the substrate 100. In general, a graphene layer 101 is formed on the upper surface of the substrate 100 employing methods known in the art. The graphene layer can be a monolayer of graphene or a two-dimensional film or a pluri-dimensional film, such as a stack of a plurality of two-dimensional graphene monolayers. The graphene layer 101 is deposited or grown on the substrate 100 by any conventional process of deposition, transfer or growing of graphene, such as by transfer of CVD graphene layer(s). The deposition/transfer/growing process is out of the scope of the present disclosure. Preferably, a graphene deposition, transfer or growing process which does not involve the graphene to be in contact with a polymer, is used. The graphene will be configured to serve as active channel or channels of one or more solid-state device, such as one or more transistors. From now on, the expression graphene layer is used to refer either to a single graphene layer or a multilayer of graphene. This method is actually suitable to fabricate devices not only with graphene but with any 2D material, such as MoS2, WS2, MoSe2, WSe2, hBN among others.

Referring to FIGS. 2A-2B, a sacrificial layer 102 (also referred to as insulating layer) is then deposited on the graphene layer 101. Sacrificial layer 102 is intended to protect the graphene layer from contamination, in particular from polymeric contamination which occurs in the process of patterning the graphene channel mainly due to the required resists. In other words, the sacrificial layer 102 prevents the graphene layer 101 from acquiring any contamination during the subsequent stages of fabrication process of the device, so that the cleaning degree of the graphene in the final device is maintained as it was prior to depositing the sacrificial layer 102. Sacrificial layer 102 also acts as dielectric layer for a subsequent contact; for example, when the graphene device to be fabricated is a GFET, sacrificial layer 102 may act as gate dielectric layer. Sacrificial layer 102 may be a chemically inert electrical insulator. Sacrificial layer 102 is made of a non-polymeric dielectric material (i.e. a non-contaminating dielectric material). The dielectric material is preferably an inorganic oxide. The material of the sacrificial layer 102 is selected to be compatible with different stages of the fabrication of the graphene device. Non-limiting examples of inorganic oxide dielectric materials used for the sacrificial layer 102 are: SiO2, Al2O3, ZrO2, HfO2, HfSiO4, Ta2O5, La2O3, LaAlO3, Nb2O5, TiO2, BaTiO3, SrTiO3, CaCu3Ti4O12, GaN, TaN, Si3N4, ZrSiO4, Y2O3, CaO, MgO, BaO, WO3, MoO3, Sc2O3, Li2O and SrO. The sacrificial layer 102 is made of a material different from a polymeric material to protect the graphene layer against polymeric contamination.

The sacrificial layer 102 may be deposited using a suitable deposition method, such as atomic layer deposition (ALD), chemical vapor deposition (CVD), Vapour Phase Epitaxy (VPE), Molecular Beam Epitaxy (MBE) and sputtering. The suitability of deposition techniques may depend on the material to be deposited. For example, ALD may be suitable to deposit certain materials, while it may be unsuitable to deposit other materials. A skilled person in the art will select a suitable deposition technique for a selected sacrificial material, preferably inorganic oxide. The thickness of the sacrificial layer 102 may be from several angstrom ($10^{-10}$ m) (for example, from 1 Å) to several microns (for example, to 100 μm). The thickness is selected taking into account different aspects.

Sacrificial layer 102 is intended to protect the graphene layer from contamination, in particular, from polymeric contamination which may occur in the process of patterning the graphene channel, mainly due to the required resists. Therefore, layer 102 is made of a non-polymeric material to protect the graphene layer against polymeric contamination.

Because the graphene is intended to serve as active channel or channels of the graphene device, the next step in the fabrication process is to pattern the graphene layer with the layout of the channel(s). The graphene layer is patterned to define one or more structures, such as one or more channel regions of a graphene device (e.g. a transistor, such as GFET) to be formed in subsequent manufacturing steps. The graphene layer 105 may be patterned by applying a conventional technique, such as a lithographic step followed by an etching step. The graphene channel(s) are defined through semiconductor lithographic techniques over the graphene layer, which can be patterned, for example following standard lithographic techniques. Non-limiting examples of semiconductor lithographic techniques that can be used for patterning the graphene layer(s) are X-ray lithography, electron-beam lithography, focused ion beam lithography, optical projection lithography, electron and ion projection lithography, nanoimprint lithography, proximity probe lithography, and near-field optical lithography. The patterns of the graphene channel(s) to be applied have been previously designed with computer-aided techniques, such as CAD software or the like.

Lithography uses for example light or electrons to transfer a geometric pattern from a mask or photomask (not shown) to a light-sensitive chemical resist or photoresist (not shown), on the substrate (in this case, sacrificial layer 102 on top of graphene layer 101). The photoresist may be made of a polymeric material, such as PMMA, or of any other conventional resin. The photoresist does not damage the graphene layer 101 thanks to the sacrificial layer 102 protecting the graphene. In other words, a light-sensitive chemical resist is first disposed on the sacrificial layer 102 on top of the graphene layer 101, and then the pattern of the photomask is exposed to be transferred to the graphene layer(s). Etching stages are then carried out to define the graphene channel(s).

Etching involves forming a multilayer etch mask (for example a photoresist), etching the graphene layer and removing (stripping, for example) the multilayer etch mask. Techniques for forming an etching mask are known to those skilled in the art and thus are not described in more detail herein. The etching step may be a dry etching step via, for example, RIE, DRIE or plasma ashing, or a wet etching step. In sum, the mask formed over the graphene layer is used to etch away unwanted areas of the graphene layer, and an etch is then used to pattern the graphene and thereby define the channel(s). After etching, the mask is removed following a conventional suitable technique. The pattern of the graphene channel(s) is thus transferred.

Figure 3B:
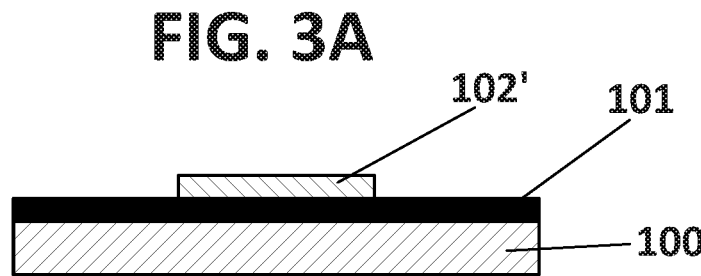
Figure 3C:
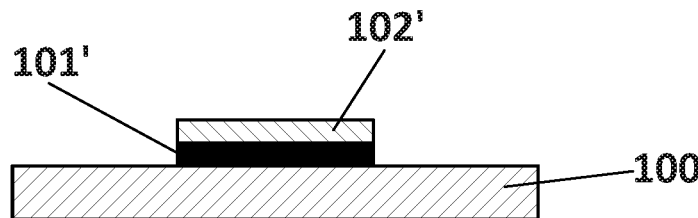
Figures 4A, 4B, 5A, 5B:
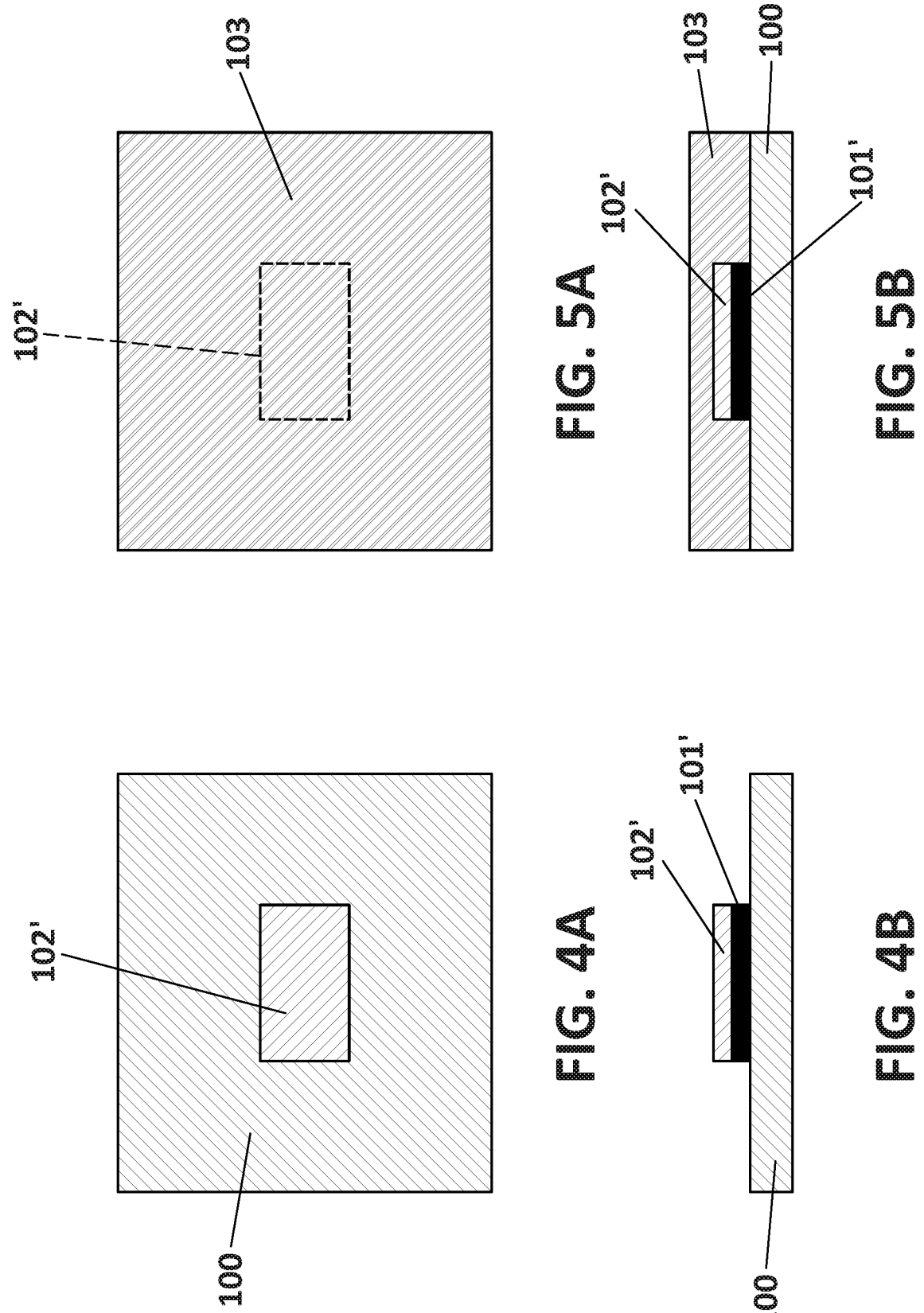
FIGS. 4A and 4B respectively illustrate a top view and a cross-section view of a lithographic process to define a graphene channel, according to another embodiment of the present disclosure.
FIGS. 5A-5B respectively illustrate a top view and a cross-section view of the stacked structure of FIG. 3C or 4B, on which a second sacrificial layer has been deposited.

In certain embodiments, a lithographic process as depicted in FIGS. 3A-3C is used to define the graphene channel(s). In a first stage, shown in FIGS. 3A-3B, a first etching technique, such as wet etching, is used to dissolve the sacrificial layer 102, exposing the graphene layer 101 underneath and transferring by means of light or electrons a geometric pattern from a mask or photomask to the light-sensitive resist. In a second stage, shown in FIG. 3C, a second etching technique, such as dry etching, such as RIE etching, is used to remove the portion of the graphene layer not covered by the sacrificial layer 102. The graphene channel has been defined on the graphene layer. The first etching stage, which is preferably a wet etching, is selective with respect to the graphene, meaning that it only removes the sacrificial layer 102 on top of the graphene layer 101. Therefore, the second etching stage is required, which is preferably dry etching, to remove the portion of the graphene layer which was previously covered by the portion of sacrificial layer 102 which has just been removed. In certain embodiments, an alternative lithographic process as depicted in FIGS. 4A-4B is used to define the graphene channel(s). In this case, a single etching stage is used to remove both the sacrificial layer 102 and the graphene layer 101 underneath, except in the area where the graphene channel(s) must be defined. This etching stage is preferably a dry etching technique. Because this etching is not selective with respect to the graphene, it removes both the sacrificial layer 102 and the graphene layer 101 underneath.

The graphene channel(s) have been defined in one of the two former alternative lithographic stages (FIGS. 3C and 4B). Because the graphene layer 101 is covered by sacrificial layer 102', graphene is not damaged by any contamination, caused for example by polymers and/or photoresins applied in the lithographic stage (FIGS. 3A and 4A). Reference 102' is now used to identify the sacrificial layer because the graphene layer underneath has been partially etched, leaving only the non-etched graphene layer 101'.

Referring to FIGS. 5A-5B, a second sacrificial layer 103 (also referred to as insulating layer) is deposited. Apart from being a mask, sacrificial layer 103 acts as dielectric layer for a subsequent contact; for example, when the graphene device to be fabricated is a GFET, sacrificial layer 103 acts as gate dielectric layer. Sacrificial layer 103 may be a chemically inert electrical insulator. The second sacrificial layer 103 is made of a dielectric material, preferably an oxide dielectric material. The second sacrificial layer 103 is therefore a dielectric layer. The material of the second sacrificial layer 103 is selected to be compatible with different stages of the fabrication of the graphene device. Non-limiting examples of oxide dielectric materials used for the second sacrificial layer 103 are: $SiO_2$, $Al_2O_3$, $ZrO_2$, $HfO_2$, $HfSiO_4$, $Ta_2O_5$, $La_2O_3$, $LaAlO_3$, $Nb_2O_5$, $TiO_2$, $BaTiO_3$, $SrTiO_3$, $CaCu_3Ti_4O_{12}$, GaN, TaN, $Si_3N_4$, $ZrSiO_4$, $Y_2O_3$, CaO, MgO, BaO, $WO_3$, $MoO_3$, $Sc_2O_3$, $Li_2O$ and SrO, but provided the material of the second sacrificial layer 103 is different from the material of which the first sacrificial layer 102 is made. Particularly, both dielectric layers 102, 103 need to have very different selectivity to at least one etchant, in such a way that, when the second dielectric layer 103 is etched with said at least one etchant, for example to expose the graphene layer 101' for a subsequent processing step, the first dielectric layer 102 is not damaged. In the context of the present disclosure, a first dielectric material is considered to have good selectivity to an etchant with respect to a second dielectric material when the etch rate of the first material is at least 2 times larger than the etch rate of the second material, such as 5 times larger, or at least 8 times larger, or at least 10 times larger. As a matter of example, Si (first material) has good selectivity to sulphuric acid $H_2SO_4$ (etchant) with respect to SiO2 (second material) because when diluted in sulphuric acid $H_2SO_4$, Si dissolves 5 times quicker than SiO2. The second sacrificial layer 103 may be deposited using a suitable deposition method, such as atomic layer deposition (ALD), chemical vapor deposition (CVP), sputtering, Vapour Phase Epitaxy (VPE) or Molecular Beam Epitaxy (MBE). The suitability of deposition techniques may depend on the material to be deposited. For example, ALD may be suitable to deposit certain materials, while it may be unsuitable to deposit other materials. The thickness of the second insulating layer 103 may be from several angstrom ($10^{-10}$ m) (for example, from 1 Å) to several microns (for example, to 100 μm). Once the graphene channel(s) are defined on the graphene layer 101' without damaging or contaminating the graphene due to the sacrificial layer 102', which protects the graphene from any contamination, the necessary contact areas for the subsequent metal contacts are defined. In the example of a GFET, the necessary contact areas are contact areas for drain, source and gate. The contact areas are defined following a lithographic process. In a particular embodiment, they are defined in two lithographic processes, as explained next.

A first lithographic process is carried out to define the preliminary contact area(s), to be eventually in contact with the graphene layer 101', on which metal will be subsequently deposited. The selection of the contact area(s) on which metal will be later deposited depends, for example, on the intended application and/or type of graphene device. In the shown example, this lithographic process defines the contact area 105 of two subsequent metallic contacts, in particular source contact and drain contact when the graphene device is a GFET. A lift-off process to define the areas in contact with the graphene layer 101' on which metallic contacts will be deposited is applied, but other metallization techniques such as electroplating combined with Chemical Mechanical Polishing (CMP) are also applicable.

The contact area 105 is an area (or several areas) in contact with the graphene layer 101', in which an electric conductive material will later be deposited, so that electric contacts (in this case, source and drain contacts) will be created. These contacts are defined through sacrificial layers 102', 103, which protect the graphene layer 101'. In the embodiment shown in FIGS. 6A-6B, the contact area 105 defined by means of a lithographic process is a contact area defined within the graphene channel, and not at the lateral side of the graphene channel (the lateral side being the border between the graphene layer and the substrate on which it is deposited). A contact area within the graphene channel is a portion of the graphene layer 101' configured to receive a metal deposition to act as electric contact. Contact areas are preferably defined within the graphene channel (either as top contacts or as edge contacts) because lateral side contact areas (at the side border between the graphene layer and the substrate) may cause detachment and misalignment problems.

Figures 6A, 6B, 7A, 7B:
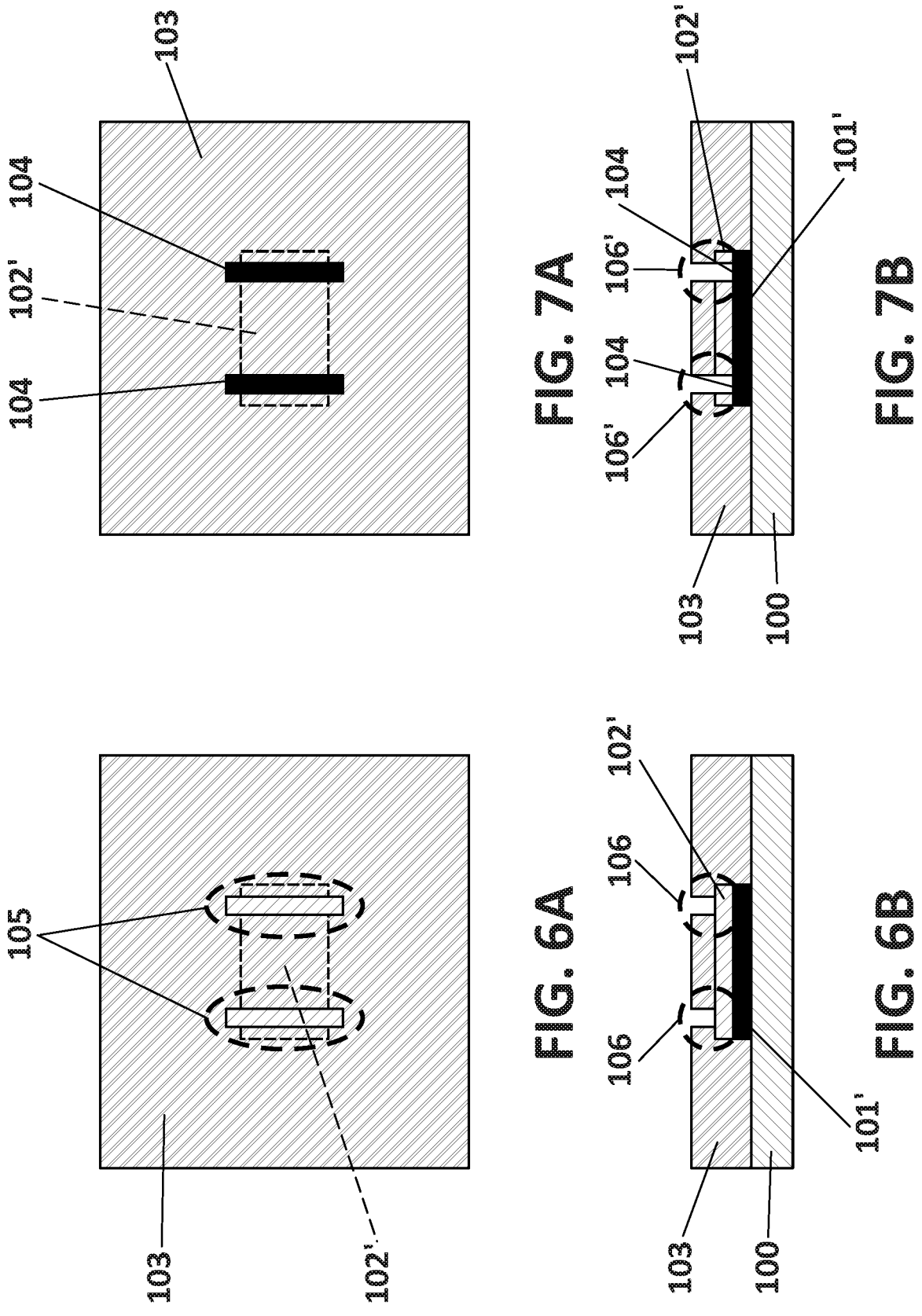
FIGS. 6A-6B respectively illustrate schematically a top view and a cross-section view of a lithographic stage to define contacts areas on which metal will be later deposited, according to an embodiment of the present disclosure.
FIGS. 7A-7B respectively illustrate a top view and a cross-section view of the stacked structure, in which an exposed graphene area is shown after applying an etching process to etch away a portion of the first sacrificial layer, according to an embodiment of the present disclosure.

Finally, an etching process is carried out to etch away the upper insulating layer 103 on the regions corresponding to the defined contact area 105, as shown in FIGS. 6A-6B. The etch process may be dry etching or wet etching. Non-limiting examples of dry etching that may be used are RIE, DRIE or Bosch etch process. Non-limiting examples of wet etching that may be used are via an acid, such as H2SO4, HCl, H3PO4, HF, HI, CH3-COOH, C6H8O, or a base, such as NaOH, KOH, TMAH, LiOH. As a result of the selective etching process, a hollow portion 106 is defined in the sacrificial layer 103, so that a portion of the lower sacrificial layer 102' is exposed in a region where a corresponding portion of sacrificial layer 103 is removed. This etchant does not need to have good selectivity against lower sacrificial layer 102' provided that the amount of etching and the thickness of the sacrificial layer 102' is suitably selected. If this etchant has good selectivity against sacrificial layer 102', this sacrificial layer 102' is not damaged by the etchant. If, instead, this etchant does not have good selectivity against sacrificial layer 102', this sacrificial layer 102' can be damaged by the etchant, but anyway sacrificial layer 102' will be removed in a subsequent stage.

Next, another lithographic process is carried out, to define the final contact area(s) on which metal will be subsequently deposited. More precisely, when the graphene device being manufactured is a GFET, this lithographic process simultaneously defines the contact area of three subsequent metallic contacts, in particular source contact, drain contact (already preliminary defined) and gate contact (defined for the first time in this lithographic process). It is noted that contact areas for, for example, drain and source contacts have so far only been predefined. The second lithographic process enables the exposure of the graphene to receive metal depositions. The source and drain areas defined in this second lithographic stage will overlap with the previous preliminary contact areas 105 defined in the first lithographic stage. Additionally, in this second lithographic stage an additional contact area is defined, in this case corresponding to a future metal deposition which will not be in contact with the graphene layer 101 (for example, gate contact when the device is a GFET). This additional contact area is preferably defined in the second lithographic process to prevent the second sacrificial layer (on which the corresponding metal contact will be later deposited) from being etched away (this would happen if the additional contact area was defined in the first lithographic process). An etching process is then carried out to etch away the lower sacrificial layer 102' on the regions corresponding to the contact area 105, under hollow portions 106, to expose the graphene area 104 to be contacted by the metal to be deposited. The exposed graphene area 104 (exposed due to hollow portions 106') can be seen in FIGS. 7A-7B, which illustrates the second etching process. Because the second dielectric layer 103 is preferably an oxide dielectric layer, the etching process needs to have good selectivity to the first dielectric layer 102, 102', so that the first dielectric layer 102, 102' is not damaged during this step. In other words, an etching process must be selected such that when applied, the second insulating layer 103 is etched (to expose the graphene channel) while the first insulating layer 102' is preserved.

This etching process is preferably wet etching. A wet etching technique is preferably selected instead of a dry one because a dry etching technique would damage the graphene channel. Non-limiting examples of wet etching that may be used are via an acid, such as H2SO4, HCl, H3PO4, HF, HI, CH3-COOH, C6H8O, or a base, such as NaOH, KOH, TMAH, LiOH. When a wet etching technique, usually an acid, is used to dissolve the dielectric (sacrificial layer), the graphene acts as an etch stopper.

However, inherent imperfections in graphene, such as micro- and nanoscopic tears in the graphene layer, can cause the etchant to diffuse through the dielectric layer. Because these tears appear randomly and are not controllable, this problem could dramatically reduce the total device yield. These problems are overcome, as already explained, by selecting an etching process having good selectivity to the first dielectric layer 102', so that the first dielectric layer 102' is not damaged during this etching step. Therefore, the etchant must have good selectivity against upper sacrificial layer 103, so that this sacrificial layer 103 (the portions thereon not etched in the first etching process, such as the lateral walls delimiting hollow portions 106) is not damaged by the etchant of the second etching process. The exposed graphene 104 to be contacted is therefore ready to receive the subsequent metal deposition.

For example, when the first dielectric layer 102 is made of Al2O3 and the second dielectric layer 103 is made of SiO$_2$, the selected etchant used to etch the second dielectric layer 103 can be, for example, sulphuric acid or phosphoric acid, because Al$_2$O$_3$ has significantly different etch rate to sulphuric acid and to phosphoric acid than SiO$_2$. Any other etchant that also fulfils that the etch rate of the Al$_2$O$_3$ is significantly different (at least 2 times) form the etch rate of the SiO$_2$ can be used instead. As a result of the selective etching process, the two portions of the graphene layer 104 become exposed for a subsequent metal deposition. In FIG. 7B, references 106' denote hollow areas free of the first and second dielectric material.

Metal contacts are then deposited following a lithographic process. In some embodiments, metal contacts are deposited following the process illustrated in FIGS. 8A-8B. In other embodiments, metal contacts are deposited following the process illustrated in FIGS. 9A-9B & 10A-10B. In both embodiments metal contacts are contacts within the graphene channel, either top contacts or edge contacts. Non-limiting examples of metals or metallic compounds used in the deposition process are: Titanium (Ti), Nickel (Ni), Gold (Au), Palladium (Pd), Cobalt (Co), Chromium (Cr), Aluminum (Al), Tungsten (W), TaN, TIN, Silicon (Si), doped Silicon (doped Si), poly-silicon (poly-Si), Cobalt monosilicide (CoSi), Platinum (Pt), Copper (Cu), Silver (Ag), Lead (Pb), Iron (Fe), Cobalt-Iron (CoFe), Zinc (Zn), Scandium (Sc), Bismuth (Bi), Niobium (Nb) and combinations/alloys of these materials or compounds. The thickness of the metal deposition 107, 108 is between 0.1 and 100 μm, such as between 1 and 1000 nm.

Figures 8A, 8B, 9A, 9B:
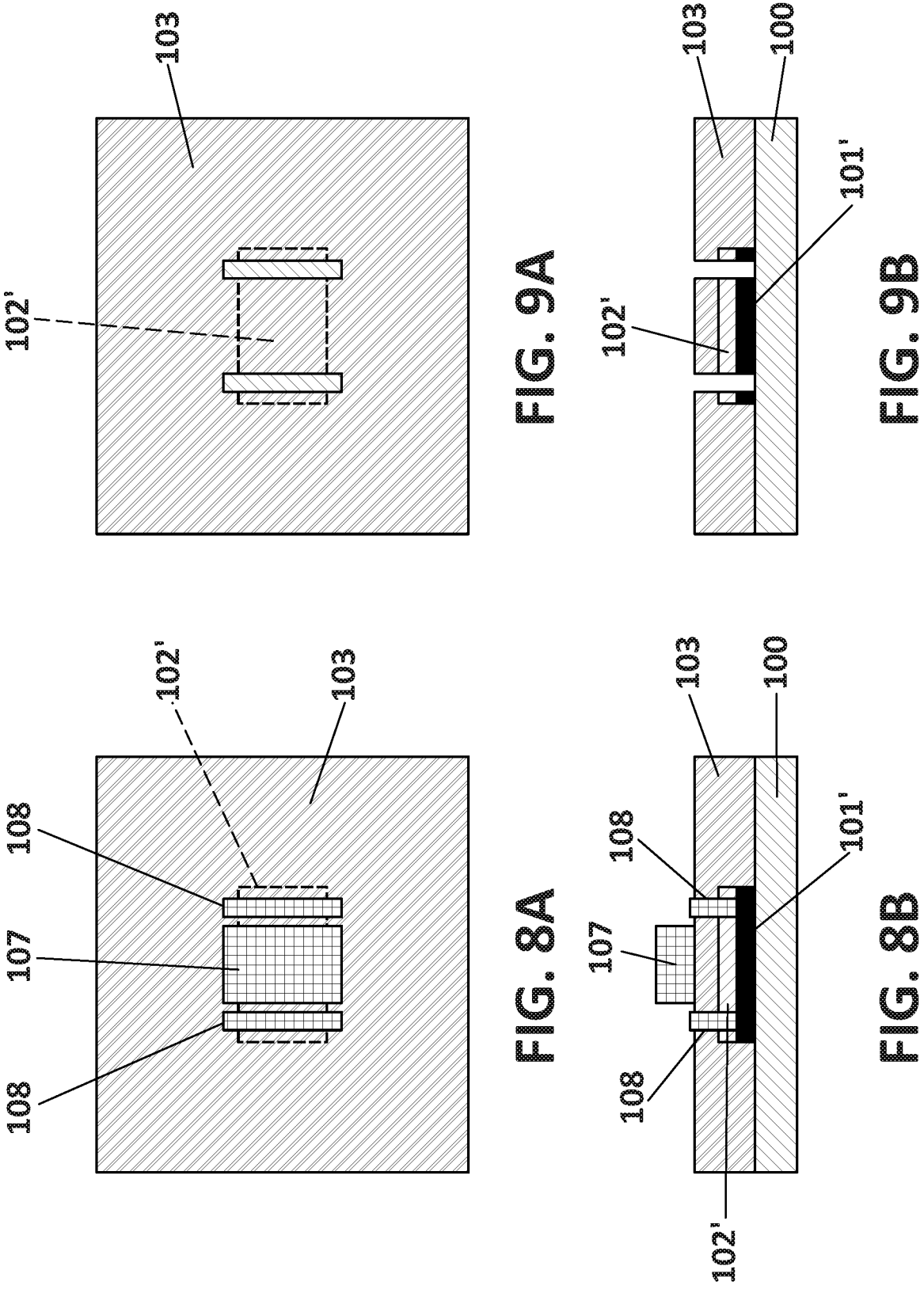

In the embodiment shown in FIGS. 8A-8B, in a single deposition stage metal is deposited on the two exposed graphene areas 104, filling the hollows 106' defined over the exposed graphene areas (metal depositions 108) and on the dielectric layer 103 (metal deposition 107) on which a gate contact has been previously defined. This third metal deposition 107 may be done on a portion of dielectric layer 103 disposed on top of the sacrificial layer 102'. For example, when the graphene device is a GFET, the two metal depositions 108 are drain and source contacts, while the third metal deposition 107 is the gate contact. Metal depositions 108 are made within the graphene channel. In this case, they are top contacts within the graphene channel.

Figures 10A, 10B, 11A, 11B:
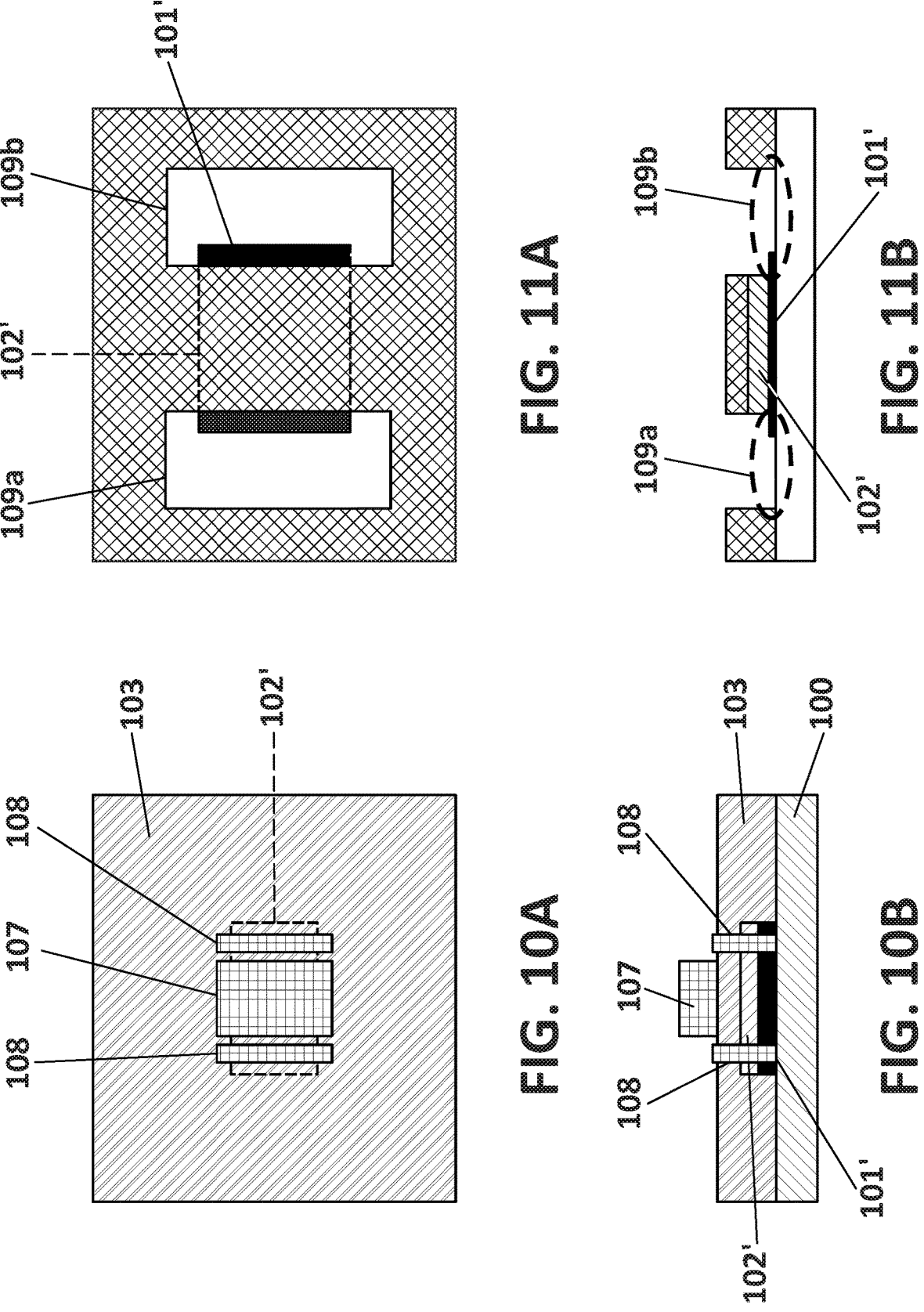

In the embodiment shown in FIGS. 9A-9B and 10A-10B, metal is also deposited in a single deposition stage. However, in this case, first (FIGS. 9A-9B) an etching stage, preferably a dry etching stage, is carried out, for example via RIE, DRIE or plasma ashing, to remove the exposed portions 104 of graphene layer 101' so that only the very edge of the graphene layer 101' (edge sides defining its thickness) is exposed. The metal contacts are then deposited (FIGS. 10A-10B). Like in FIGS. 8A-8B, the metal is deposited on the two exposed graphene areas 104 (in the second case shown in FIGS. 9A-10B, only on the edges of the graphene layer), filling the hollows 106' defined over the exposed graphene areas (metal depositions 108) and on the dielectric layer 103 (metal deposition 107). This third metal deposition 107 may be done on a portion of dielectric layer 103 disposed on top of the sacrificial layer 102'. For example, when the graphene device is a GFET, the two metal depositions 108 are drain and source contacts, while the third metal deposition 107 is the gate contact. Here, metal depositions 108 are also made within the graphene channel. However, in this case, they are edge contacts within the graphene channel.

The graphene device has thus been metallized, for example following a top contact approach, such as via evaporation of metal, such as thermal evaporation or e-beam evaporation, or by electro-deposition, or by electroplating. Preferably, a non-aggressive deposition technique is used for applying the metallization, so that the graphene channel is not damaged. In particular, any deposition technique which does not use plasma is preferably used, although sputtering is also usable.

The device is produced just with one metal step, reducing processing steps and material consumption. Because of the single metal deposition step, the three contacts are aligned. Besides, the process flow prevents the contact of the graphene with the photoresist, which may worsen the final quality of the device. The graphene device is therefore a non-contaminated graphene device.

In addition, when the metallic contacts (such as drain and source contacts when the device is a GFET) are defined and built within the graphene channel, instead of at the lateral sides thereof (in areas of the graphene delimiting with, for example, the substrate) as is the case in standard contact schemes, the alignment tolerance is relaxed, because the lateral sides of the graphene channel can be extended as much as needed without altering the actual length or width of the device. This also avoids large lateral sides exposure of the photoresist developers that can cause detachment of the graphene film, deteriorating the quality of the contact. In sum, this contact geometry prevents misalignment problems and graphene detachment).

In addition, because the metallic contacts 108 (such as drain and source contacts when the device is a GFET) are defined and built within the graphene channel, instead of at the lateral sides 108a, 108b thereof (in lateral areas of the graphene when a cross-section view is considered, delimiting with, for example, the substrate) as is the case in standard contact schemes, as shown in FIGS. 11A & 11B, the alignment tolerance is relaxed, because the lateral sides of the graphene channel can be extended as much as needed without altering the actual length or width of the device.

This also avoids large lateral sides exposure of the photoresist developers that can cause detachment of the graphene film, deteriorating the quality of the contact. In sum, this contact geometry prevents misalignment problems and graphene detachment. FIGS. 11A and 11B are shown in comparison with the stack shown in FIGS. 9A-9B (graphene area exposed to be contacted). The stack of FIGS. 11A-11B has followed, regarding the creation of contact areas (to receive metallic deposition), a standard contact approach, in which the contact areas 109a, 109b are defined at the lateral sides of the graphene channel. As shown in FIGS. 11C-11D, a small misalignment 110 causes bad graphene/contact overlap, that is to say, a non-contacted device. Furthermore, as shown in FIGS. 11E-11F, it implies a larger area exposed to the photoresist developer, causing detachment and bad graphene/contact overlap area 111, that is to say, non-contacted graphene device.

Figure 12A:
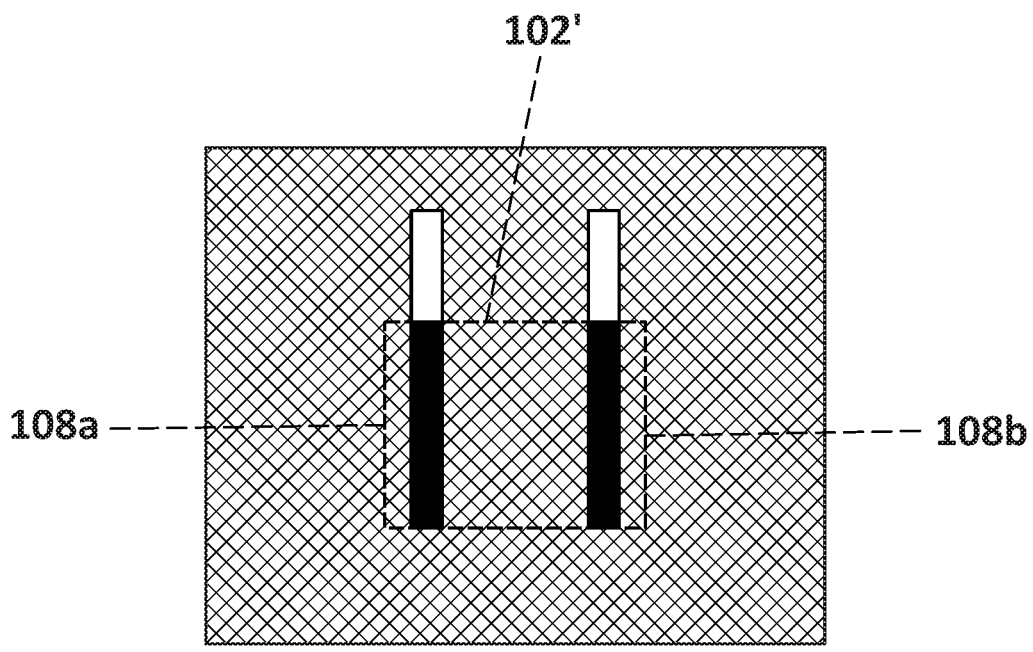
FIGS. 12A-12F illustrate top and cross-section views of a graphene structure obtained during the fabrication stages of a graphene device using a proposed contact approach, in which the contact areas to receive metal depositions are defined within the graphene channel.
Figure 12B:
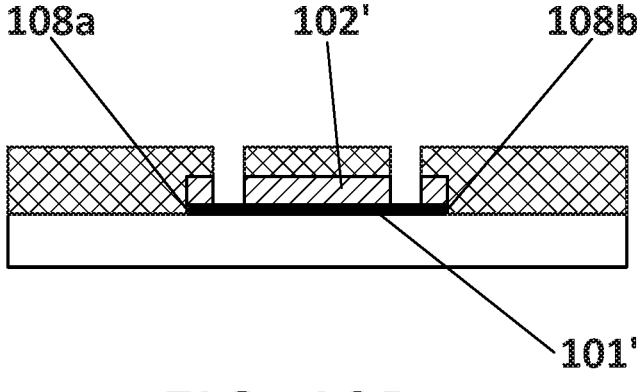
Figures 12C, 12D, 12E, 12F:
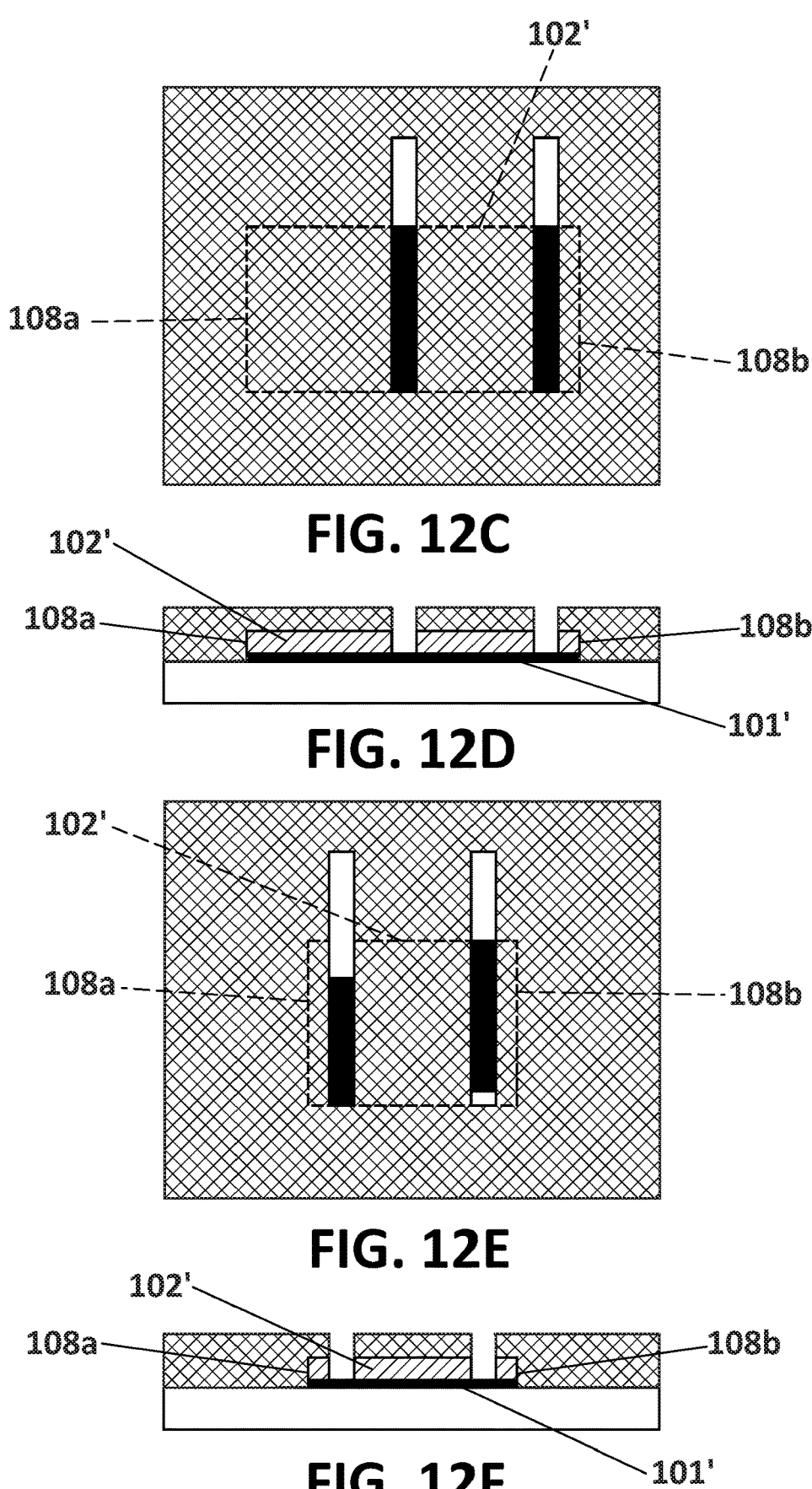

By contrast, the proposed contact approach (FIGS. 12A-12F) in which the metal contacts are defined within the graphene channel and not at the lateral sides 108a 108b thereof, overcomes these problems. The channel length can be increased as much as the alignment needs without sacrificing neither channel length nor graphene/contact overlap area, as shown in FIGS. 12C-12D. The contact is therefore always good. Furthermore, the lateral sides and surface exposed to the photoresist developer is minimized, thus detachment is minimized and good graphene/contact overlap area is obtained, as shown in FIGS. 12E-12F. The contact is thus always good.

In this text, the term "comprises" and its derivations (such as "comprising", etc.) should not be understood in an excluding sense, that is, these terms should not be interpreted as excluding the possibility that what is described and defined may include further elements, steps, etc.

In the context of the present disclosure, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

The disclosure is obviously not limited to the specific embodiment(s) described herein, but also encompasses any variations that may be considered by any person skiled in the art (for example, as regards the choice of materials, dimensions, components, configuration, etc.), within the general scope of the disclosure as defined in the claims.

The invention claimed is:

1. A method of fabricating a graphene-based solid-state device, the method including the following steps:
  disposing a graphene layer on a substrate;
  depositing a first layer of a sacrificial material on the graphene layer,
  the first layer of a sacrificial material being made of a first oxide dielectric material;
  patterning the graphene layer by defining at least one channel region, wherein
  the patterning is done by applying a lithographic process followed by an etching process;
  depositing a second layer of a sacrificial material on a stacked structure,
  the second layer of a sacrificial material being made of a second oxide dielectric material different of the first oxide dielectric material of which the first layer of a sacrificial material is made; and wherein
  the selectivity to at least one etchant of the first oxide dielectric material is different from the selectivity to said at least one etchant of the second oxide dielectric material;
  defining contact areas on which metal will be subsequently deposited;
  etching away portions of the second and first layers of sacrificial material, thus defining hollow portions through which graphene areas are exposed, and
  in a single deposition stage, applying metal depositions on the defined contact areas.

2. The method of claim 1, wherein the substrate is made of a material comprising at least one of the following: glass, quartz, silicon (Si), germanium (Ge), silicon carbide, silicon oxide, gallium arsenide, SiO2/Si, SiO2, Al2O3, ZrO2, HfO2, HfSiO4, Ta2O5, La2O3, LaAlO3, Nb2O5, TiO2, BaTiO3, SrTiO3, CaCu3Ti4O12, Si3N4, ZrSiO4, Y2O$_3$, CaO, MgO, BaO, WO3, MoO3, Sc2O3, Li2O and SrO.

3. The method of claim 1, wherein defining contact areas on which metal will be subsequently deposited and etching away portions of the second and first layers of sacrificial material, thus defining hollow portions through which graphene areas are exposed, are done as follows:
  applying a first lithographic process to define preliminary areas in contact with the graphene channel on which metal will be subsequently deposited,
  applying an etching process to etch away the second layer of a sacrificial material on the region corresponding to the defined preliminary areas, thus defining hollow portions through which corresponding portions of the first layer of a sacrificial material is exposed,
  applying a second lithographic process to define contact areas on which metal will be subsequently deposited, said contact areas comprising as many areas as metallic contacts are going to be deposited, and
  applying an etching process to etch away the first layer of a sacrificial material on the defined contact areas on which metallic contacts are going to be deposited, thus defining a hollow portion through which a corresponding graphene area is exposed.

4. The method of claim 1, wherein the first oxide dielectric material is an inorganic oxide dielectric material.

5. The method of claim 1, wherein the second oxide dielectric material is an inorganic oxide dielectric material.

6. The method of claim 4, wherein the first oxide dielectric material is selected from the following group: SiO2, Al2O3, ZrO2, HfO2, HfSiO4, Ta2O5, La2O3, LaAlO3, Nb2O5, TiO2, BaTiO3, SrTiO3, CaCu3Ti4O12, GaN, TaN, Si3N4, ZrSiO4, Y2O3, CaO, MgO, BaO, WO3, MoO3, Sc2O3, Li2O and SrO.

7. The method of claim 4, wherein the second oxide dielectric material is selected from the following group: SiO2, Al2O3, ZrO2, HfO2, HfSiO4, Ta2O5, La2O3, LaAlO3, Nb2O5, TiO2, BaTiO3, SrTiO3, CaCu3Ti4O12, GaN, TaN, Si3N4, ZrSiO4, Y2O3, CaO, MgO, BaO, WO3, MoO3, Sc2O3, Li2O and SrO, provided that the second oxide dielectric material is different of the first oxide dielectric material and the selectivity to at least one etchant of the first oxide dielectric material is different from the selectivity to said at least one etchant of the second oxide dielectric material.

8. The method of claim 1, wherein the patterning of the graphene channel is done as follows:
  applying a wet etching technique to dissolve the area of the first layer of a sacrificial material not covered by a resist layer, exposing the graphene layer(s) underneath, and
  applying a dry etching technique to remove the area of graphene layer(s) not covered by the first layer of a sacrificial material.

9. The method of claim 1, wherein the patterning of the graphene channel is done as follows:
  applying a dry etching technique to remove both the area of the first layer of a sacrificial material and the graphene layer(s) underneath.

10. The method of claim 1, wherein the preliminary area in contact with the graphene channel on which metal will be subsequently deposited is an area on top of the graphene channel.

11. The method of claim 1, wherein the preliminary area in contact with the graphene channel on which metal will be subsequently deposited is an area at the edge of the graphene channel.

12. The method of claim 1, wherein the etchant used in the stage of applying an etching process to etch away the second layer of a sacrificial material on the region corresponding to the defined area, thus defining a hollow portion through which a portion of the first layer of a sacrificial material is exposed, does not need to have good selectivity against the first layer of sacrificial material.

13. The method of claim 1, wherein the etchant used in the stage of applying an etching process to etch away the first layer of a sacrificial material on the defined contact area on which metallic contacts are going to be deposited, thus defining a hollow portion through which a corresponding graphene area is exposed, has good selectivity to the first layer of sacrificial material, so that the first layer of sacrificial material is not damaged.

\* \* \* \* \*